United States Patent
Chen et al.

(10) Patent No.: US 10,361,181 B2
(45) Date of Patent: Jul. 23, 2019

(54) PACKAGING MECHANISMS FOR DIES WITH DIFFERENT SIZES OF CONNECTORS

(71) Applicant: Taiwan Semiconductor Manufacturing Company, Ltd., Hsinchu (TW)

(72) Inventors: Chih-Hua Chen, Zhubei (TW); Chen-Shien Chen, Zhubei (TW); Ching-Wen Hsiao, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/911,398

(22) Filed: Mar. 5, 2018

(65) Prior Publication Data

US 2018/0197846 A1   Jul. 12, 2018

Related U.S. Application Data

(60) Continuation of application No. 15/585,971, filed on May 3, 2017, now Pat. No. 9,911,725, which is a
(Continued)

(51) Int. Cl.
*H01L 25/00* (2006.01)
*H01L 21/66* (2006.01)
(Continued)

(52) U.S. Cl.
CPC .......... *H01L 25/50* (2013.01); *H01L 21/4853* (2013.01); *H01L 22/14* (2013.01); *H01L 23/13* (2013.01); *H01L 23/49805* (2013.01); *H01L 23/49811* (2013.01); *H01L 23/49816* (2013.01); *H01L 23/49822* (2013.01); *H01L 23/49827* (2013.01); *H01L 23/49833* (2013.01);
(Continued)

(58) Field of Classification Search
None
See application file for complete search history.

(56) References Cited

U.S. PATENT DOCUMENTS

| 4,811,082 A | 3/1989 | Jacobs et al. |
| 4,990,462 A | 2/1991 | Sliwa, Jr. |

(Continued)

FOREIGN PATENT DOCUMENTS

| DE | 3705828 A1 | 10/1987 |
| DE | 10110203 A1 | 9/2002 |

(Continued)

*Primary Examiner* — Telly D Green
(74) *Attorney, Agent, or Firm* — Slater Matsil, LLP

(57) ABSTRACT

A semiconductor package includes a package substrate. A redistribution structure is bonded to the package substrate. A bottommost surface of the redistribution structure is lower than a topmost surface of the package substrate. A conductive connector electrically couples the redistribution structure to the package substrate. The conductive connector physically contacts a sidewall of the redistribution structure. A first integrated circuit die is bonded to the redistribution structure through first bonding structures and is bonded to the package substrate through second bonding structures. The first bonding structures and the second bonding structures have different sizes.

20 Claims, 14 Drawing Sheets

Related U.S. Application Data division of application No. 13/922,023, filed on Jun. 19, 2013, now Pat. No. 9,646,894.

(60) Provisional application No. 61/798,136, filed on Mar. 15, 2013.

(51) Int. Cl.

| | | |
|---|---|---|
| *H01L 23/498* | (2006.01) | |
| *H01L 23/00* | (2006.01) | |
| *H01L 23/13* | (2006.01) | |
| *H01L 25/065* | (2006.01) | |
| *H01L 25/18* | (2006.01) | |
| *H01L 21/48* | (2006.01) | |
| *H01L 23/64* | (2006.01) | |
| *H01L 25/10* | (2006.01) | |
| *H01L 25/16* | (2006.01) | |

(52) U.S. Cl.
CPC .............. *H01L 24/14* (2013.01); *H01L 24/16* (2013.01); *H01L 24/17* (2013.01); *H01L 25/0655* (2013.01); *H01L 25/18* (2013.01); *H01L 23/64* (2013.01); *H01L 25/105* (2013.01); *H01L 25/16* (2013.01); *H01L 2224/131* (2013.01); *H01L 2224/13005* (2013.01); *H01L 2224/1403* (2013.01); *H01L 2224/16145* (2013.01); *H01L 2224/16238* (2013.01); *H01L 2224/1703* (2013.01); *H01L 2224/81815* (2013.01); *H01L 2924/12042* (2013.01); *H01L 2924/1305* (2013.01); *H01L 2924/13091* (2013.01); *H01L 2924/15192* (2013.01); *H01L 2924/15311* (2013.01); *H01L 2924/181* (2013.01); *H01L 2924/19107* (2013.01)

(56) References Cited

U.S. PATENT DOCUMENTS

| | | | |
|---|---|---|---|
| 5,075,253 | A | 12/1991 | Sliwa, Jr. |
| 5,380,681 | A | 1/1995 | Hsu |
| 5,447,264 | A | 9/1995 | Koopman et al. |
| 5,481,133 | A | 1/1996 | Hsu |
| 5,773,880 | A | 6/1998 | Ohno |
| 5,929,521 | A | 7/1999 | Wark et al. |
| 6,001,493 | A | 12/1999 | Rutledge et al. |
| 6,002,177 | A | 12/1999 | Gaynes et al. |
| 6,187,678 | B1 | 2/2001 | Gaynes et al. |
| 6,220,499 | B1 | 4/2001 | Brofman et al. |
| 6,229,216 | B1 | 5/2001 | Ma et al. |
| 6,236,115 | B1 | 5/2001 | Gaynes et al. |
| 6,271,059 | B1 | 8/2001 | Bertin et al. |
| 6,279,815 | B1 | 8/2001 | Correia et al. |
| 6,355,501 | B1 | 3/2002 | Fung et al. |
| 6,434,016 | B2 | 8/2002 | Zeng et al. |
| 6,448,661 | B1 | 9/2002 | Kim et al. |
| 6,461,895 | B1 | 10/2002 | Liang et al. |
| 6,562,653 | B1 | 5/2003 | Ma et al. |
| 6,570,248 | B1 | 5/2003 | Ahn et al. |
| 6,600,222 | B1 | 7/2003 | Levardo |
| 6,607,938 | B2 | 8/2003 | Kwon et al. |
| 6,661,085 | B2 | 12/2003 | Kellar et al. |
| 6,762,076 | B2 | 7/2004 | Kim et al. |
| 6,790,748 | B2 | 9/2004 | Kim et al. |
| 6,887,769 | B2 | 5/2005 | Kellar et al. |
| 6,894,378 | B2 | 5/2005 | Winderl |
| 6,908,565 | B2 | 6/2005 | Kim et al. |
| 6,908,785 | B2 | 6/2005 | Kim |
| 6,924,551 | B2 | 8/2005 | Rumer et al. |
| 6,943,067 | B2 | 9/2005 | Greenlaw |
| 6,946,384 | B2 | 9/2005 | Kloster et al. |
| 6,975,016 | B2 | 12/2005 | Kellar et al. |
| 7,037,804 | B2 | 5/2006 | Kellar et al. |
| 7,056,807 | B2 | 6/2006 | Kellar et al. |
| 7,087,538 | B2 | 8/2006 | Staines et al. |
| 7,151,009 | B2 | 12/2006 | Kim et al. |
| 7,157,787 | B2 | 1/2007 | Kim et al. |
| 7,215,033 | B2 | 5/2007 | Lee et al. |
| 7,276,799 | B2 | 10/2007 | Lee et al. |
| 7,279,795 | B2 | 10/2007 | Periaman et al. |
| 7,307,005 | B2 | 12/2007 | Kobrinsky et al. |
| 7,317,256 | B2 | 1/2008 | Williams et al. |
| 7,320,928 | B2 | 1/2008 | Kloster et al. |
| 7,345,350 | B2 | 3/2008 | Sinha |
| 7,402,442 | B2 | 7/2008 | Condorelli et al. |
| 7,402,515 | B2 | 7/2008 | Arana et al. |
| 7,402,901 | B2 | 7/2008 | Hatano et al. |
| 7,410,884 | B2 | 8/2008 | Ramanathan et al. |
| 7,432,592 | B2 | 10/2008 | Shi et al. |
| 7,462,511 | B2 | 12/2008 | Yamagata |
| 7,494,845 | B2 | 2/2009 | Hwang et al. |
| 7,528,494 | B2 | 5/2009 | Furukawa et al. |
| 7,531,890 | B2 | 5/2009 | Kim |
| 7,557,597 | B2 | 7/2009 | Anderson et al. |
| 7,576,435 | B2 | 8/2009 | Chao |
| 7,834,450 | B2 | 11/2010 | Kang |
| 7,915,741 | B2 | 3/2011 | Lau et al. |
| 8,227,904 | B2 | 7/2012 | Braunisch et al. |
| 8,817,511 | B2 | 8/2014 | McCarthy et al. |
| 2002/0045293 | A1 | 4/2002 | Tsunoi |
| 2002/0063319 | A1 | 5/2002 | Huang et al. |
| 2002/0135055 | A1 | 9/2002 | Cho et al. |
| 2003/0230805 | A1 | 12/2003 | Noma et al. |
| 2006/0240595 | A1 | 10/2006 | Lee et al. |
| 2006/0267188 | A1 | 11/2006 | Ishino et al. |
| 2007/0013063 | A1 | 1/2007 | Khandekar et al. |
| 2007/0080442 | A1 | 4/2007 | Meyer-Berg |
| 2008/0057837 | A1 | 3/2008 | Shiratani et al. |
| 2008/0315409 | A1 | 12/2008 | Cordes et al. |
| 2009/0244874 | A1* | 10/2009 | Mahajan ............... H01L 24/16 361/809 |
| 2009/0278263 | A1 | 11/2009 | McCarthy et al. |
| 2010/0072601 | A1 | 3/2010 | Tanaka |
| 2010/0213608 | A1 | 8/2010 | Lau et al. |
| 2010/0244024 | A1 | 9/2010 | Do et al. |
| 2011/0068465 | A1 | 3/2011 | Shen et al. |
| 2011/0092064 | A1 | 4/2011 | Liu et al. |
| 2011/0101527 | A1 | 5/2011 | Cheng et al. |
| 2012/0106117 | A1 | 5/2012 | Sundaram et al. |
| 2013/0134582 | A1 | 5/2013 | Yu et al. |
| 2013/0168848 | A1 | 7/2013 | Lin et al. |
| 2013/0168854 | A1 | 7/2013 | Karikalan et al. |
| 2014/0048928 | A1 | 2/2014 | Li et al. |
| 2014/0252561 | A1 | 9/2014 | Lisk et al. |
| 2014/0264337 | A1 | 9/2014 | Chen et al. |
| 2014/0264769 | A1 | 9/2014 | Chen et al. |

FOREIGN PATENT DOCUMENTS

| | | | |
|---|---|---|---|
| DE | 112007002587 T5 | 9/2009 | |
| JP | 09260420 A | * 10/1997 | ............ H01L 21/60 |
| JP | H09260420 A | 10/1997 | |
| WO | 2008057837 A1 | 5/2008 | |

* cited by examiner

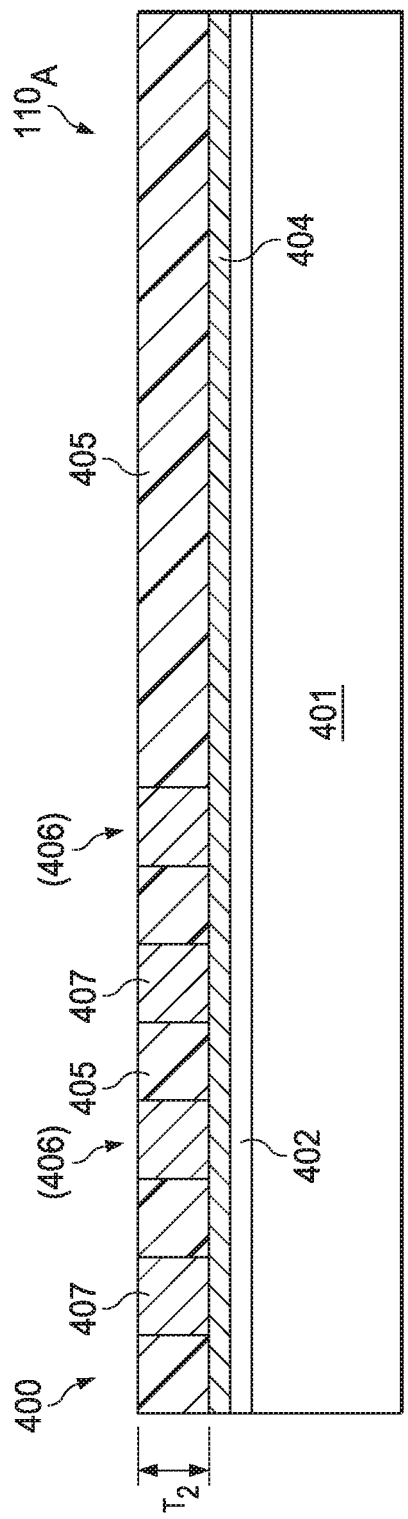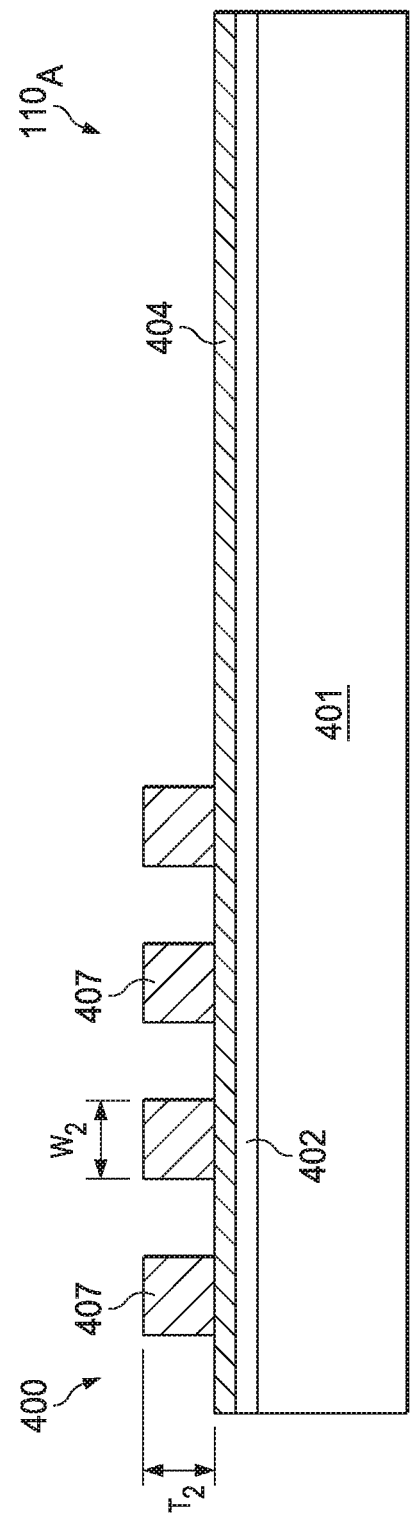

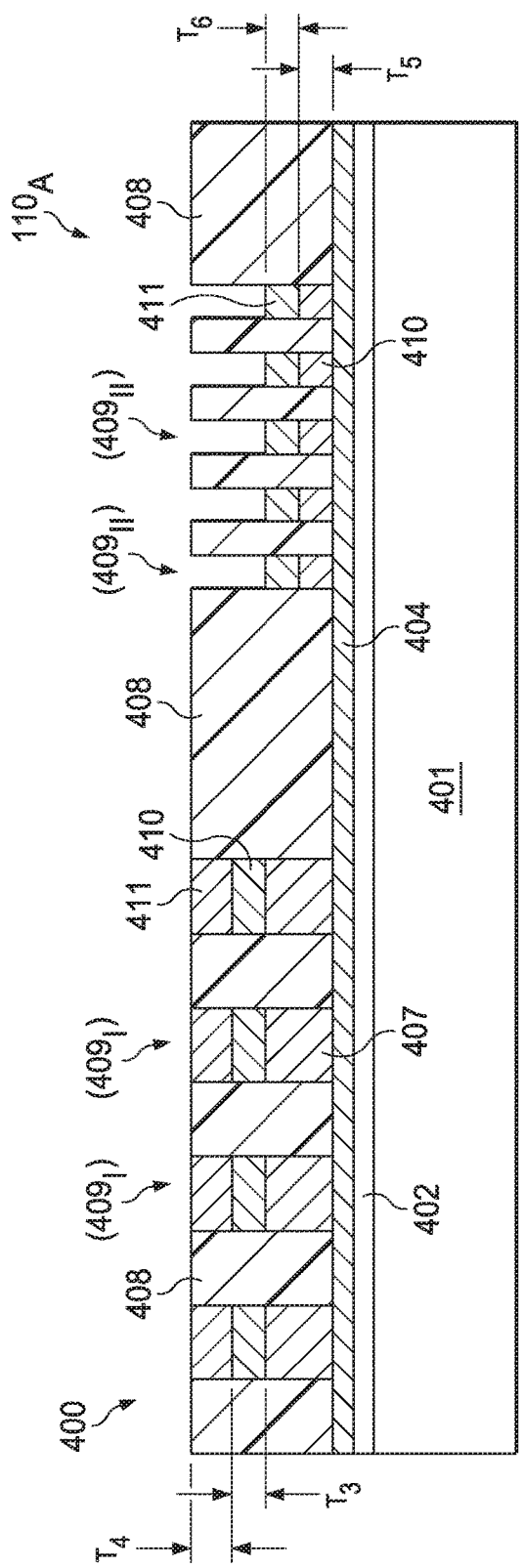
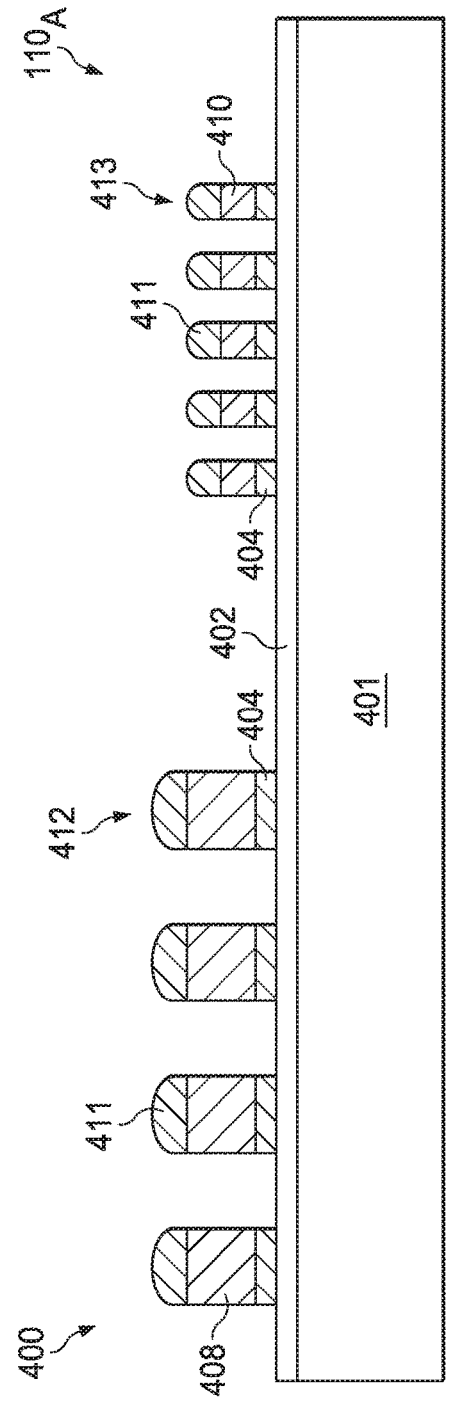
FIG. 4D
FIG. 4E

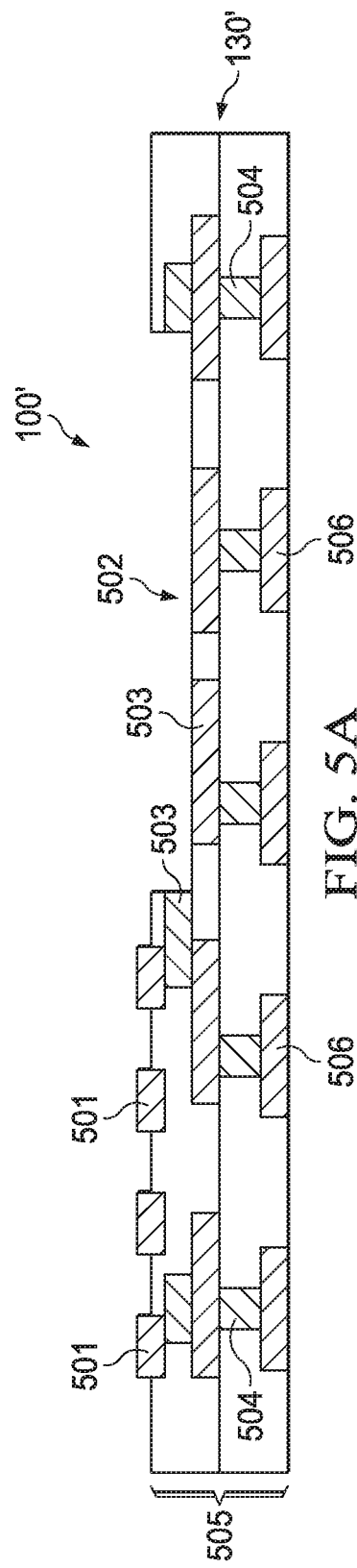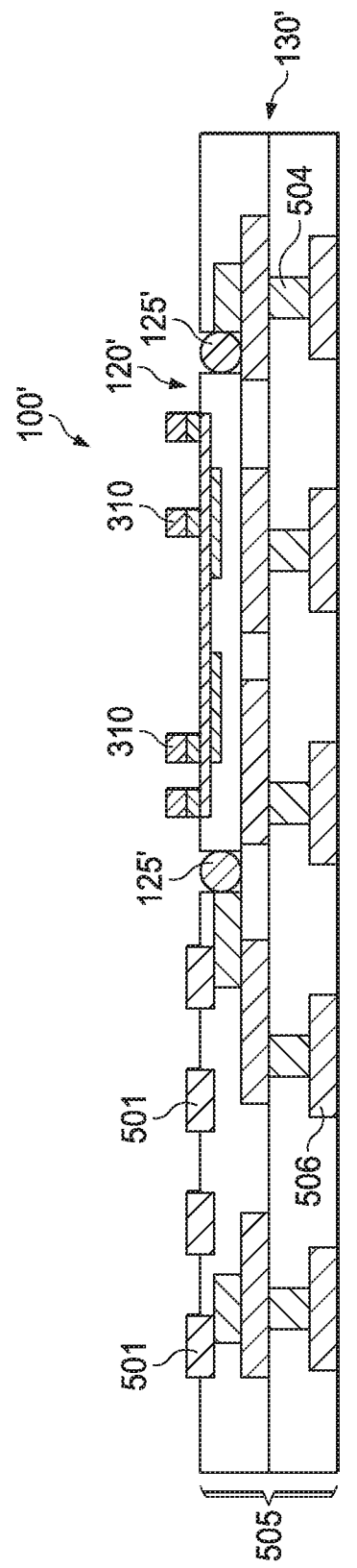

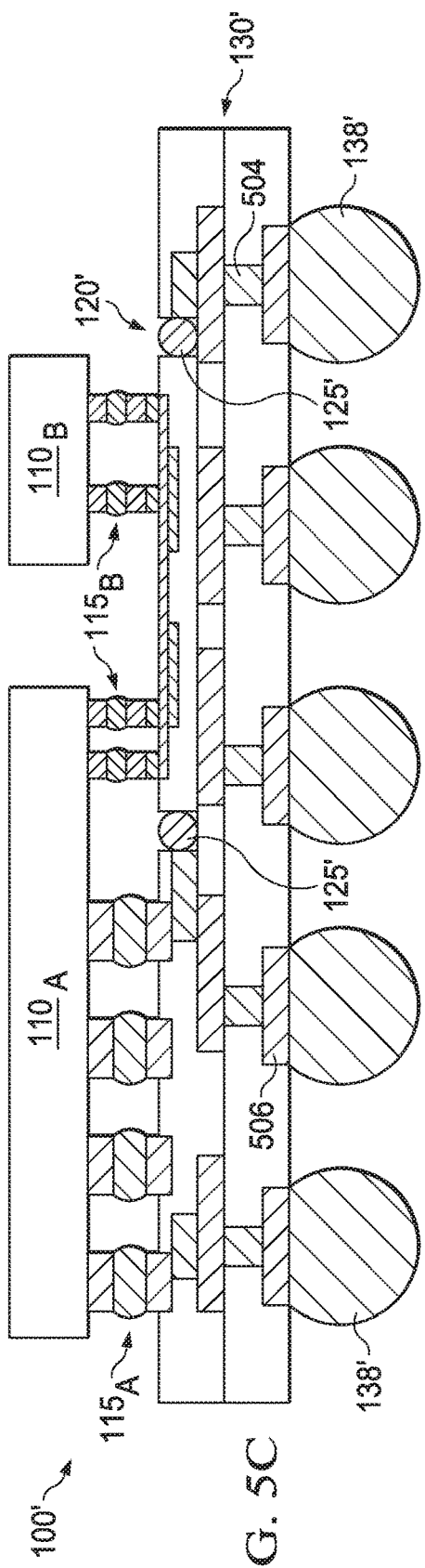
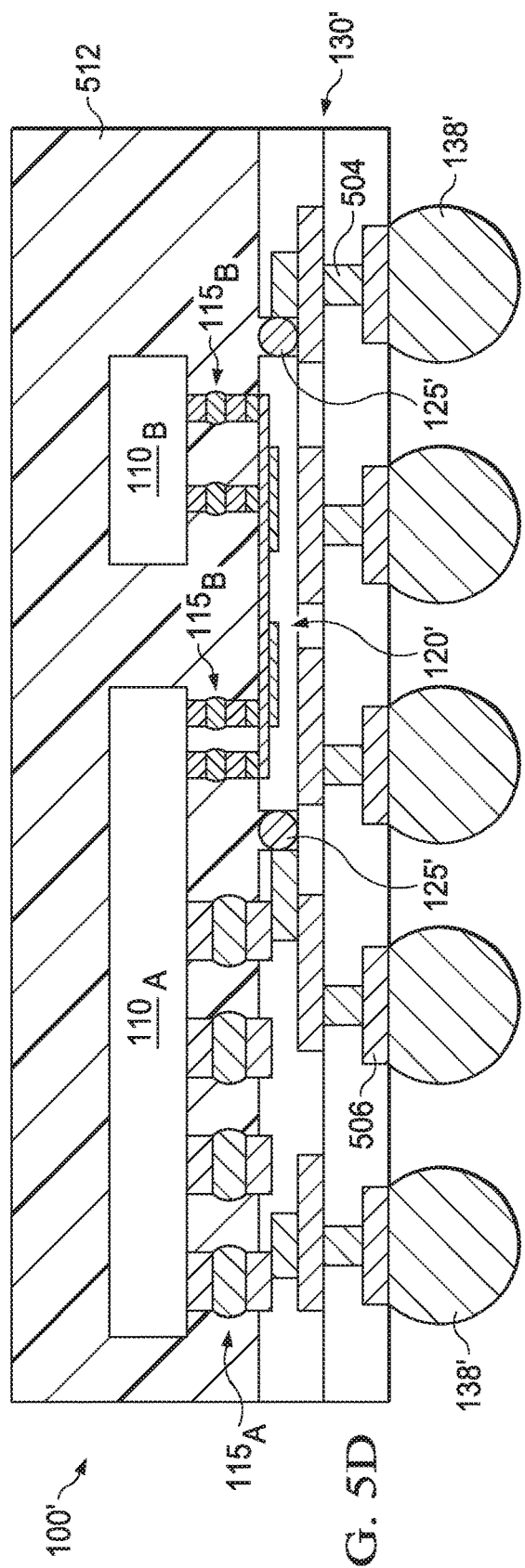

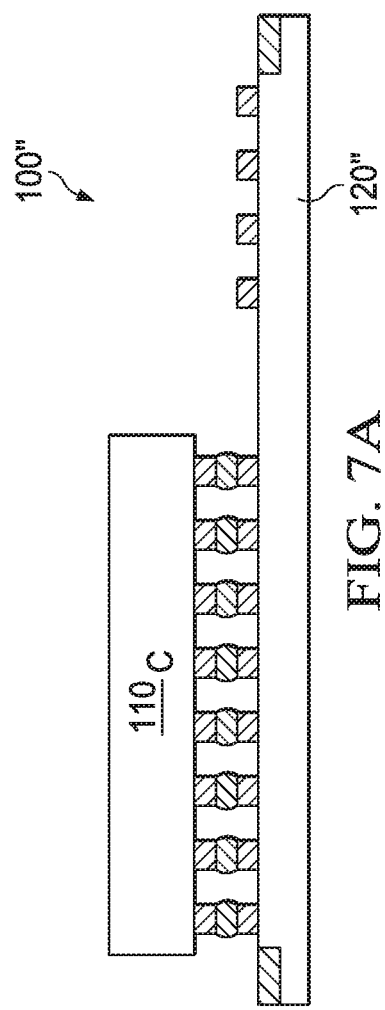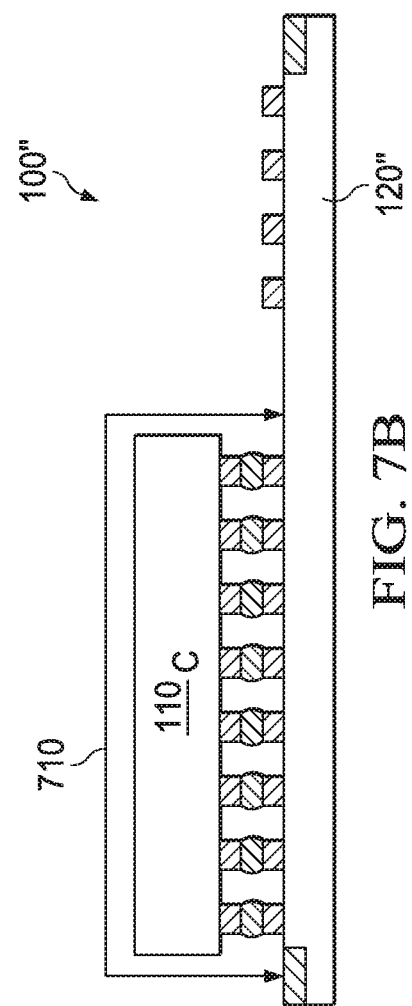

PACKAGING MECHANISMS FOR DIES WITH DIFFERENT SIZES OF CONNECTORS

PRIORITY CLAIM AND CROSS-REFERENCE

This application is a continuation of and claims priority to U.S. patent application Ser. No. 15/585,971, filed on May 3, 2017, entitled "Packaging Mechanisms for Dies With Different Sizes of Connectors," which is a divisional of U.S. patent application Ser. No. 13/922,023, filed on Jun. 19, 2013, entitled "Packaging Mechanisms for Dies With Different Sizes of Connectors," which claims priority to U.S. Provisional Application Ser. No. 61/798,136, filed on Mar. 15, 2013, entitled "Method and Apparatus for Package Structure," which applications are hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area and/or lower height than packages of the past, in some applications.

Thus, new packaging technologies have begun to be developed. By adopting the new packaging technologies, the integration levels of the packages may be increased. These relatively new types of packaging technologies for semiconductors face manufacturing challenges.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 4A-4E illustrate cross-sectional views of a sequential flow of forming packaged die, in accordance with some embodiments.

FIGS. 5A-5D illustrate cross-sectional views of a sequential flow of forming die package, in accordance with some embodiments.

FIGS. 7A-7E illustrate cross-sectional views of a sequential flow of forming die package, in accordance with some embodiments.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

The making and using of the embodiments of the present disclosure are discussed in detail below. It should be appreciated, however, that the present disclosure provides many applicable inventive concepts that can be embodied in a wide variety of specific contexts. The specific embodiments discussed are illustrative and do not limit the scope of the disclosure.

Figure 1:
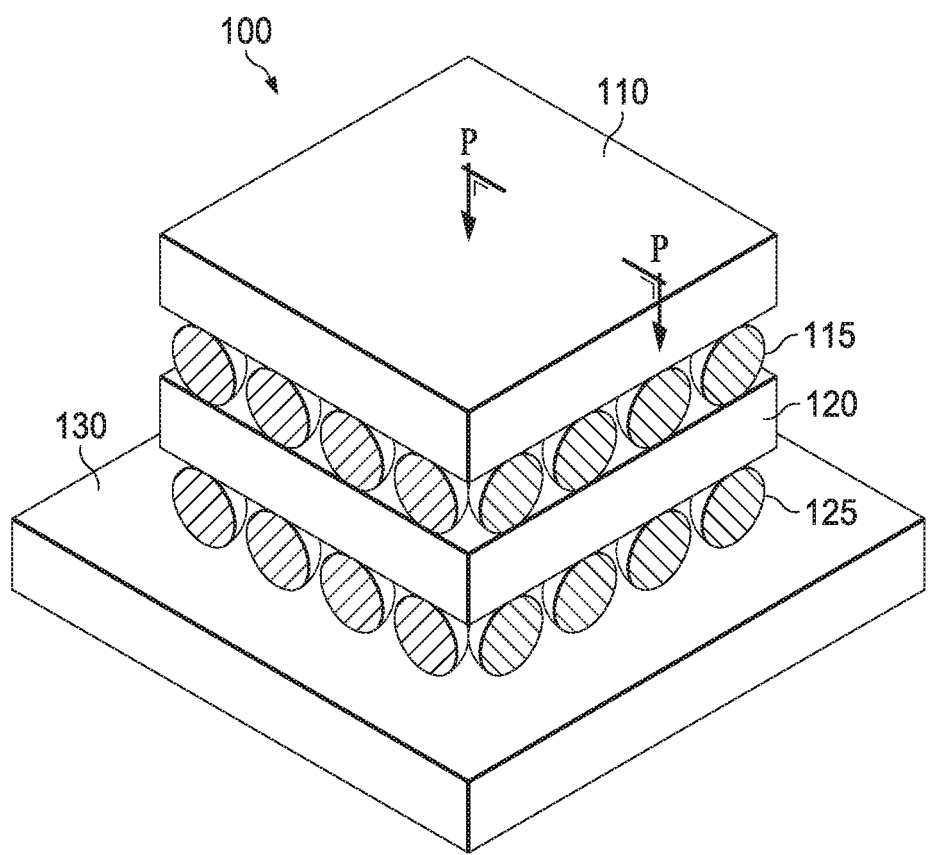
FIG. 1 is a perspective view of a die package, in accordance with some embodiments.

FIG. 1 is a perspective view of a die package 100 including a packaged die 110 bonded to an interconnect structure 120, which is further bonded to a substrate (or package substrate) 130 in accordance with some embodiments. Two or more packaged dies can be bonded to the interconnect structure 120. The two or more packaged dies could be different from one another. However, two or more of the packaged dies bonded to the interconnect structure 120 could be identical. For example, two identical packaged memory dies and a packaged processing-unit die, such as central processing unit (CPU) or graphic processing unit (GPU), could be bonded to interconnect structure 120.

Each packaged die, such as packaged die 110 includes at least a semiconductor die (not shown). The semiconductor die includes a semiconductor substrate as employed in a semiconductor integrated circuit fabrication, and integrated circuits may be formed therein and/or thereupon. The semiconductor substrate refers to any construction comprising semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The semiconductor substrate may further comprise a plurality of isolation features (not shown), such as shallow trench isolation (STI) features or local oxidation of silicon (LOCOS) features. The isolation features may define and isolate the various microelectronic elements. Examples of the various microelectronic elements that may be formed in the semiconductor substrate include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and/or other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices.

Interconnect substrate 120 may be made of a semiconductor wafer, or a portion of wafer. In some embodiments, interconnect substrate 120 includes silicon, gallium arsenide, silicon on insulator ("SOI") or other similar materials. Interconnect substrate 120 include interconnect structures or redistribution layer(s) (RDL) (not shown) to electrically connect packaged die 110 and substrate 130. RDLs are interconnect structures near the surface of die packages or on packaging structures to facilitate electrical connections. In some embodiments, interconnect substrate 120 also includes passive devices such as resistors, capacitors, inductors and the like, or active devices such as transistors. In some embodiments, substrate 130 includes additional integrated circuits. Interconnect substrate 120 may further include through substrate vias (TSVs) and may be an interposer. In addition, the interconnect substrate 120 may be made of other materials. In some embodiments, interconnect substrate 120 also includes bismaleimide triazine (BT) resin, FR-4 (a composite material composed of woven fiberglass cloth with an epoxy resin binder that is flame resistant), ceramic, glass, plastic, glass-fiber, silicon/glass interposer or other supporting materials that may carry the conductive pads or lands needed to receive conductive terminals.

Substrate 130 may be made of a semiconductor wafer, or a portion of wafer. In some embodiments, substrate 130 includes silicon, gallium arsenide, silicon on insulator ("SOI") or other similar materials. In some embodiments, substrate 130 also includes passive devices such as resistors, capacitors, inductors and the like, or active devices such as transistors. In some embodiments, substrate 130 includes additional integrated circuits. In addition, the substrate 130 may be made of other materials. For example, in some embodiments, substrate 130 is a multiple-layer circuit board. In some embodiments, substrate 130 also includes bismaleimide triazine (BT) resin, FR-4 (a composite material composed of woven fiberglass cloth with an epoxy resin binder that is flame resistant), ceramic, glass, plastic, tape, film, or other supporting materials that may carry the conductive pads or lands needed to receive conductive terminals.

Packaged die 110 is bonded to interconnect substrate 120 via connectors 115, and interconnect substrate 120 is bonded to substrate 130 via connectors 125. If two or more packaged dies, such as packaged die 110 and other packaged die(s), with different sizes of connectors are bonded to interconnect substrate 120, the packaging mechanisms could be challenging. Further, the cost of manufacturing the die package, such as die package 100, also needs to be taken into consideration. Interconnect substrates 120 with TSVs, which are also called interposers, provide functions for electrical connection and heat dissipation. However, interposers are expensive. For some applications that require low-cost die packages, alternative die package structures and methods for forming them are needed.

Figure 2A:
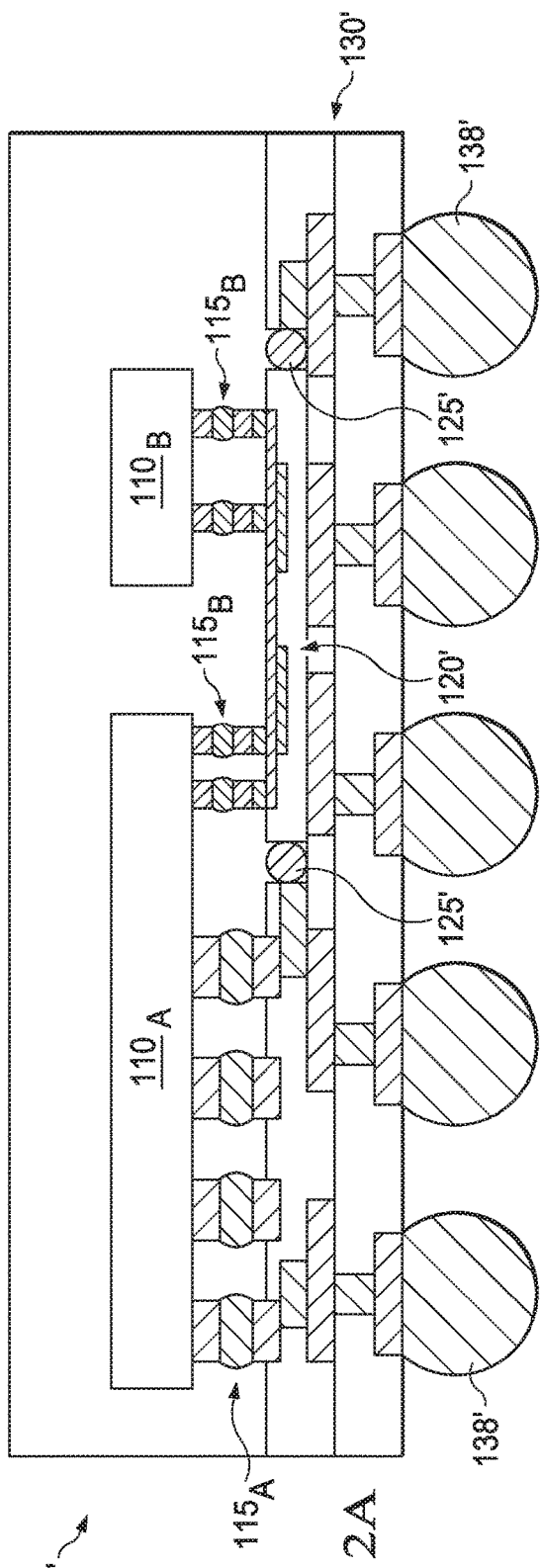
FIG. 2A shows a cross-sectional view of a die package, in accordance with some embodiments.

FIG. 2A shows a cross-sectional view of a die package 100', in accordance with some embodiments. Die package 100' includes a packaged die 110$_A$ and a packaged die 110$_B$. For example, packaged die 110$_A$ could be a central processing unit (CPU) or graphic control unit (GPU), and packaged die 110B could be a memory device, such as static random-access memory (SRAM) dynamic random-access memory (DRAM), or other types of memory devices. Packaged die 110$_B$ could have a large number of inputs/outputs (I/Os). As a result, the external connectors for packaged die 110$_B$ are small bumps, such as micro-bumps (μ-bumps). Packaged die 110$_A$ has connectors with different sizes. FIG. 2A shows packaged die 110$_A$ has large connectors and small connectors. The small connectors are about the same size as the connectors of packaged die 110$_B$. The large connectors of packaged die 110$_A$ are bonded directly to substrate (or package substrate) 130' to form bonding structures 115$_A$. The small connectors of packaged die 110$_A$ and packaged die 110$_B$ are bonded to an interconnect substrate 120' to form bonding structures 115$_B$. The interconnect substrate 120' is electrically connected to interconnect structure 135 of substrate 130' via connectors 125'. FIG. 2A also shows external connectors 138' bonded to substrate 130'.

Figure 2B:
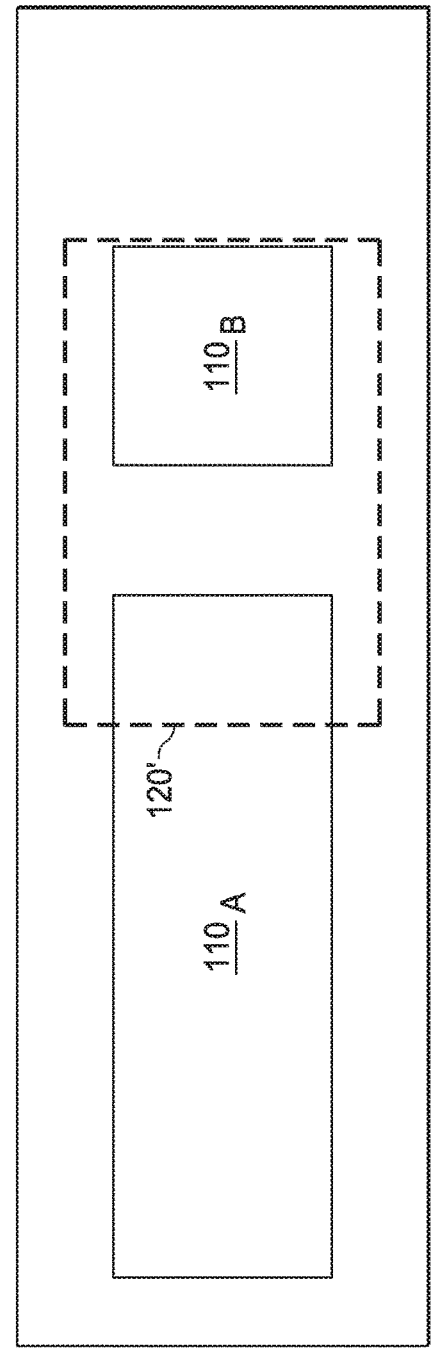
FIG. 2B shows a top view of die package of FIG. 2A, in accordance with some embodiments.

FIG. 2B shows a top view of die package 100' of FIG. 2A, in accordance with some embodiments. FIG. 2B shows that packaged die 110$_A$ is placed next to packaged die 110$_B$. Interconnect substrate 120' is disposed below packaged die 110$_B$ and a portion of packaged die 110$_A$. The bonding scheme shown in FIG. 2A does not involve a substrate with TSVs, whose manufacturing cost is high. As a result, the scheme in FIG. 2A saves manufacturing cost. Embodiments of mechanisms for forming die package 100' are described below.

Figure 3A:
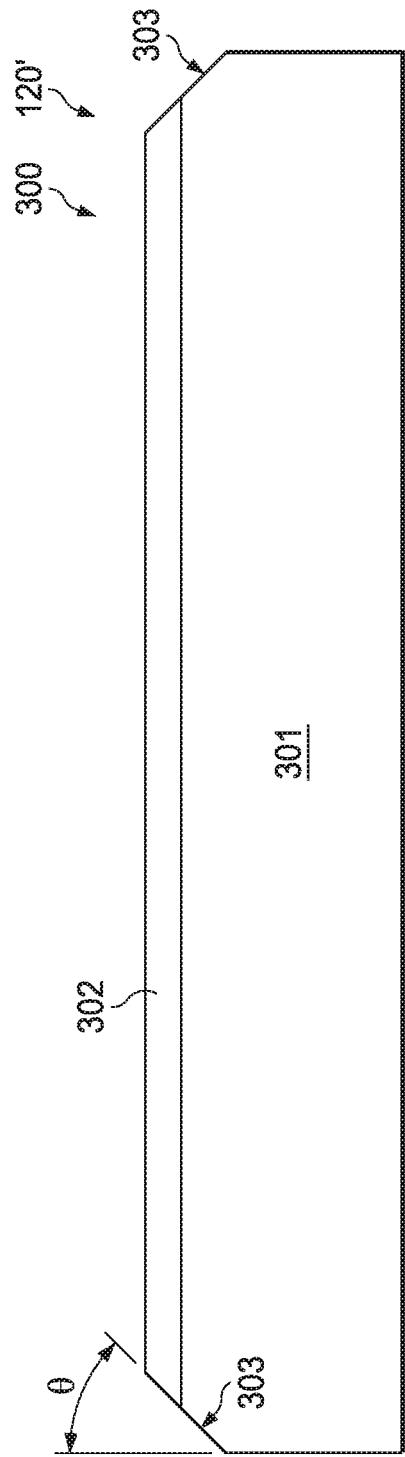
FIGS. 3A-3E illustrate cross-sectional views of a sequential flow of forming an interconnect substrate, in accordance with some embodiments.

FIGS. 3A-3E illustrate cross-sectional views of a sequential flow of forming interconnect substrate 120', in accordance with some embodiments. FIG. 3A shows a redistribution structure 302 formed over a substrate 301. As mentioned above, the substrate 301 for interconnect substrate 120' may be made of a semiconductor wafer, glass, or other applicable materials. In some embodiments, substrate 301 includes silicon, gallium arsenide, silicon on insulator ("SOI"), glass or other similar materials. FIGS. 3A-3E only show a region 300 of a single interconnect substrate 120'. During processing, a number of interconnect substrate 120' are formed on substrate 301. At the end of the processing sequence, substrate 301 is sawed to separate into individual interconnect substrate 120'. Interconnect substrate 120' does not contain active devices, such as transistors, memory devices, etc. and does not contain passive devices, such as resistors or capacitors, in some embodiments. As a result, the manufacturing cost of interconnect substrate 120' is relative low and lower than interposer with TSVs. In some embodiments, interconnect substrate 120' contains passive devices. Even if the interconnect substrate 120' contains passive devices, the manufacturing cost of interconnect substrate 120' is still much lower than an interposer substrate with TSVs.

FIGS. 3A-3E show region 300 of interconnect substrate 120', in accordance with some embodiments. During processing, the substrate 301 includes a number of regions similar to region 300 for forming additional interconnect substrates 120'. The redistribution structure 302 includes one or more redistribution layers (RDLs) (not shown), which are insulated by passivation layers. Examples of redistribution structures and bonding structures, and methods of forming them are described in U.S. application Ser. No. 13/427,753, entitled "Bump Structures for Multi-Chip Packaging," filed on Mar. 22, 2012, and U.S. application Ser. No. 13/338,820, entitled "Packaged Semiconductor Device and Method of Packaging the Semiconductor Device," filed on Dec. 28, 2011. Both above-mentioned applications are incorporated herein by reference in their entireties.

FIG. 3A also shows that corners 303 are formed by removing portions of substrate 301. In some embodiments, corners 303 are removed by laser (a laser-grooving process), which removes trenches in substrate 301. Other material-removal process may also be used. Region 300 includes corners 303, which are half of the trenches. FIG. 3A shows that each of corners 303 has a slanted sidewall. In some embodiments, the angle, θ, between the slanted sidewall and a normal to the substrate surface is in a range from about 30 degrees to about 60 degrees. Corners 303 can be formed before or after the formation of redistribution structure 302.

Figure 3B:
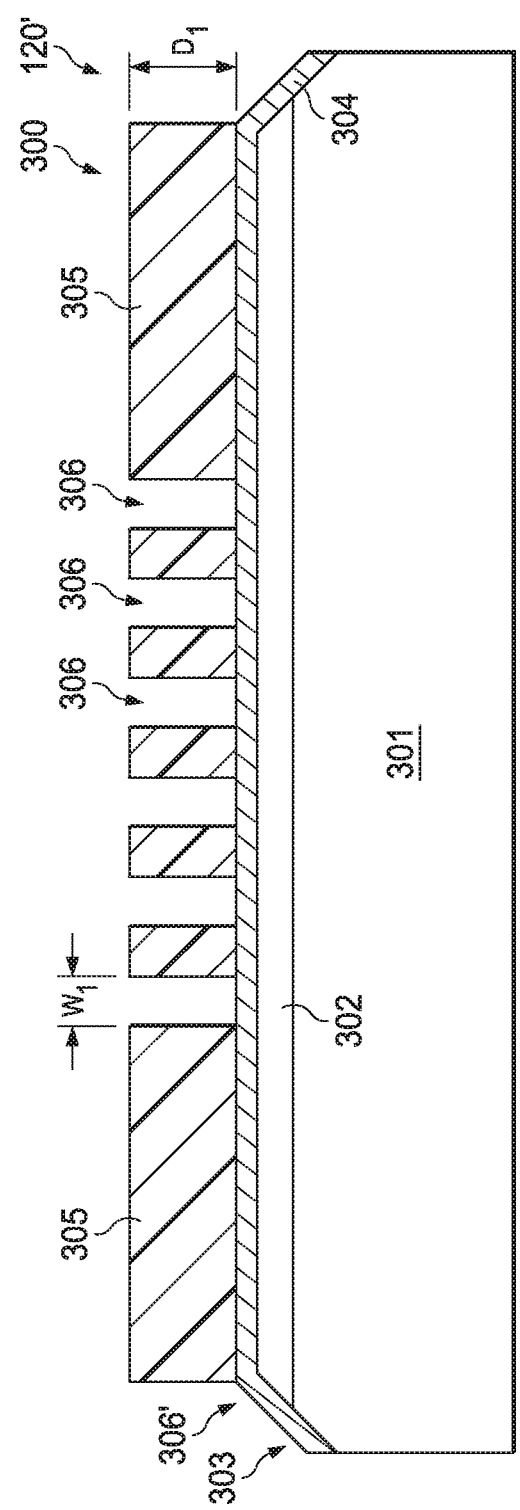

A plating seed layer 304 is then formed on redistribution structure 302 as shown in FIG. 3B in accordance with some embodiments. In some embodiments, the plating seed layer 304 is made of copper and is formed by physical vapor deposition (PVD). However, other conductive film may also be used. For example, the plating seed layer 304 may be made of Ti, Ti alloy, Cu, and/or Cu alloy. The Ti alloy and Cu alloy may include silver, chromium, nickel, tin, gold, tungsten, and combinations thereof. In some embodiments, the thickness of the plating seed layer 304 is in a range from about 0.1 μm to about 0.8 μm. In some embodiments, the plating seed layer 304 includes a diffusion barrier layer, which is formed prior to the deposition of the plating seed layer. The plating seed layer 304 may also act as an adhesion layer to under layer. In some embodiments, the diffusion barrier layer is made of Ti with a thickness in a range from about 0.03 μm to about 0.1 μm. However, the diffusion barrier layer may be made of other materials, such as TaN, or other applicable materials and the thickness range is not limited to the range described above. The diffusion barrier layer is formed by PVD in some embodiments.

After plating seed layer 304 is formed, a photoresist layer 305 is defined over it, as shown in FIG. 3B in accordance with some embodiments. The photoresist layer 305 may be formed by a wet process, such as a spin-on process, or by a dry process, such as by applying a dry film over the surface of the plating seed layer 304. After the photoresist layer 305 is formed, the photoresist layer 305 is patterned to formed openings 306, which are used form connectors (or bonding structures, such as bumps) for the single interconnect substrate 120'. FIG. 3B also shows that photoresist layer 305 is also removed near corners 303 to form exposed regions 306'. The patterning processes involved include photolithography and resist development. In some embodiments, the width $W_1$ of openings 306 is in a range from about 10 μm to about 60 μm. In some embodiments, the depth $D_1$ of openings 306 is in a range from about 15 μm to about 80 μm.

Figure 3C:
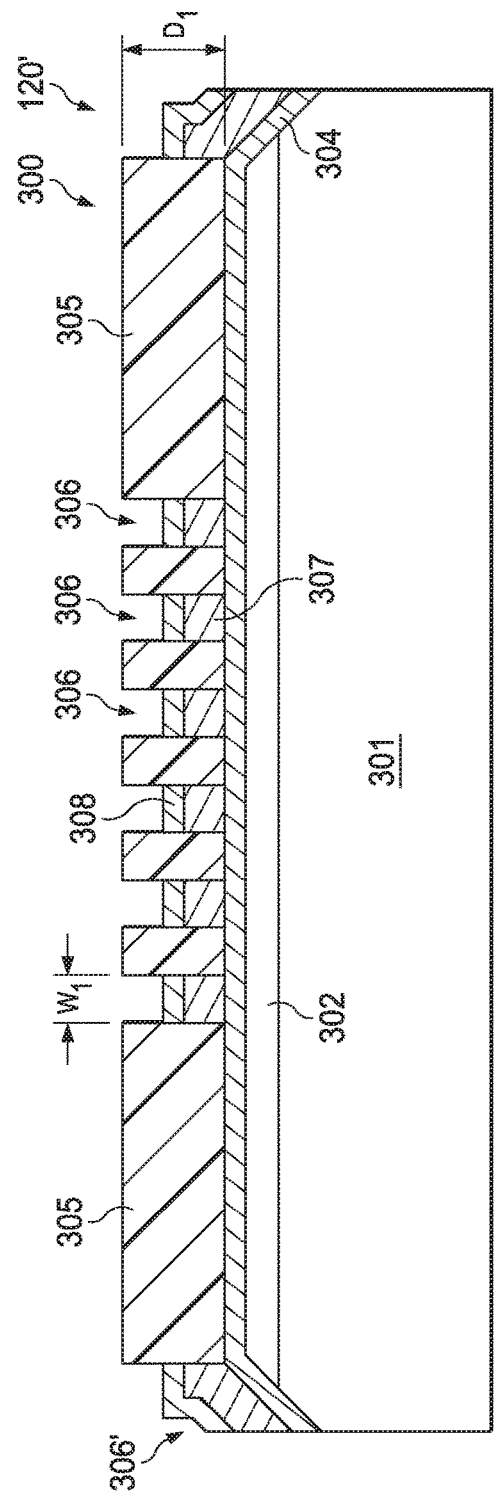

Afterwards, a conductive layer 307 is plated on the surface of exposed plating seed layer 304, such as over the surfaces in openings 306 and over surfaces of exposed regions 306' (over corners 303), in accordance with some embodiments. The conductive layer 307 is made of copper, copper alloy, or a combination thereof in some embodiments. Following the formation of the first conductive layer 307, a solder layer 308 is formed over conductive layer 307. In some embodiments, both the conductive layer 307 and solder layer 308 are formed by plating processes. FIG. 3C shows the conductive layer 307 and solder layer 308 after their formation, in accordance with some embodiments. In some embodiments, the thickness of conductive layer 307 in openings 306 is in a range from about 10 μm to about 30 μm. In some embodiments, the thickness of solder layer 308 in openings 306 is in a range from about 5 μm to about 30 μm.

The thickness of conductive layer 307 and solder layer 308 over exposed regions 306' are thicker than in openings 306 due to larger exposed surface area during plating processes. In some embodiments, the thickness of conductive layer 307 over exposed regions 306' is in a range from about 12 μm to about 40 μm. In some embodiments, the thickness of solder layer 308 over exposed regions 306' is in a range from about 5 μm to about 40 μm.

Figure 3D:
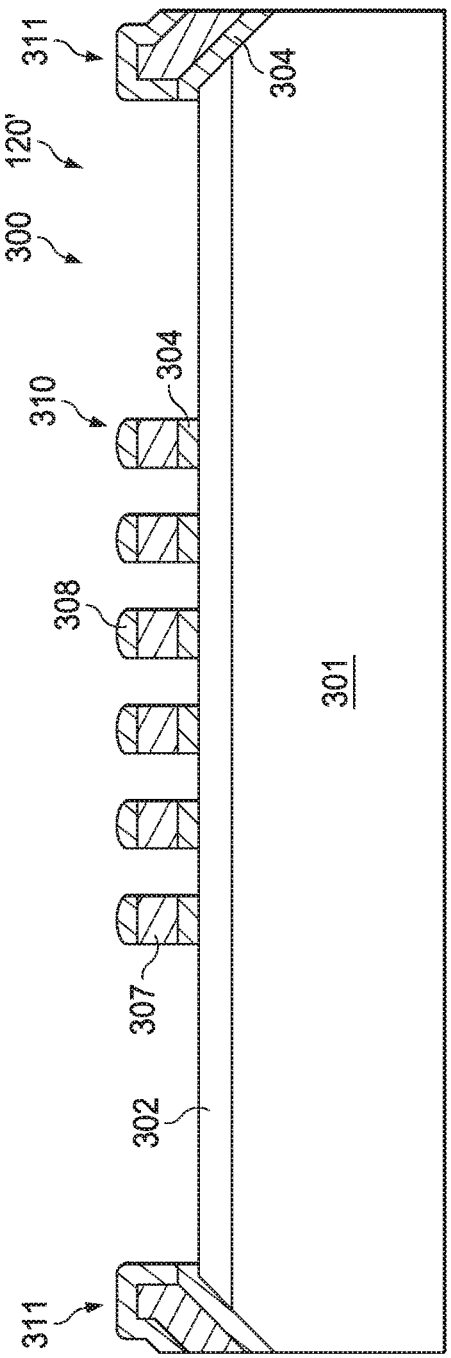

After the formation of the conductive layer 307 and solder layer 308, the photoresist layer 305 is removed, as shown in FIG. 3D in accordance with some embodiments. The removal process may involve dry or wet etching. An etch process is then performed to remove the plating seed layer 304 not covered by conductive layer 307 and solder layer 308.

After the photoresist layer 305 is removed and the etching of exposed plating seed layer 304, the conductive layer 307 and solder layer 308 in the openings 306 are exposed to form external connectors (or bump structures) 310. The exposed conductive layer 307 and solder layer 308 formed over the posed regions 306' form contact structures 311.

A reflow process is then conducted to reflow the solder layer 308 over the patterned conductive layer 307 to prepare external connectors 310 for bonding. The solder layer 308 covering the conductive layer 307 near over exposed regions 306' is also reflowed to cover side wall(s) of conductive layer 307, as shown in FIG. 3D in accordance with some embodiments.

Figure 3E:
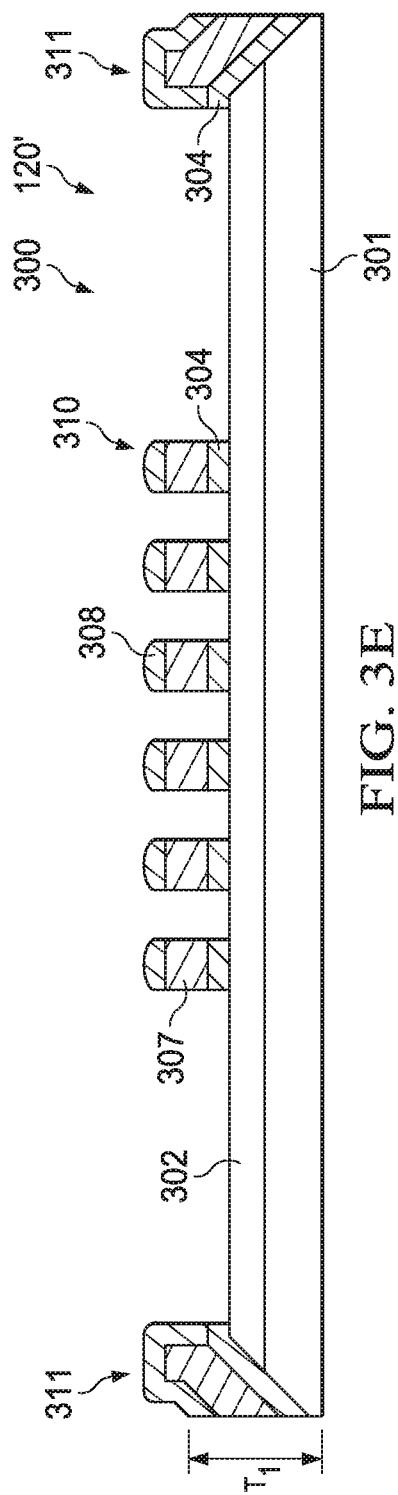

Following the reflow process described above, substrate 301 is thinned down to a thickness $T_1$, as shown in FIG. 3E in some embodiments. The thinning process may apply a grinding process. In some embodiments, thickness $T_1$ is in a range from about 20 μm to about 50 μm. Following the thinning process, region 300 is singulated into individual piece from the entire substrate 301 for further packaging, to be described below. The singulation process is a sawing process, in accordance with some embodiments. In some embodiments, neighboring contact structures 311 of neighboring interconnect substrate 120' are connected to one another prior to singulation process and are separated from one another after the singulation process. A portion of each contact structure 311 is in the scribe line, which is the region for sawing blade to cut through, for such embodiments.

Figure 4A:
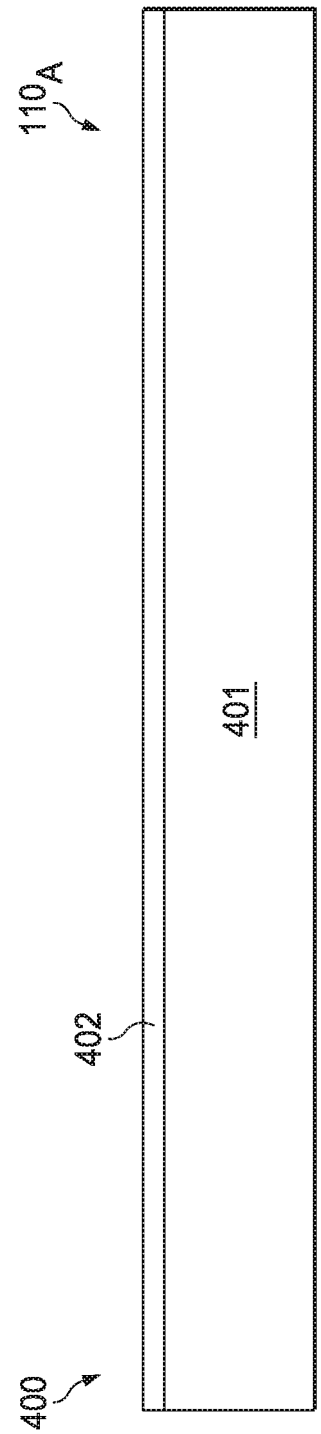

FIGS. 4A-4E illustrate cross-sectional views of a sequential flow of forming packaged die $110_A$, in accordance with some embodiments. FIG. 4A shows a redistribution structure 402 formed over a region 400 of substrate 401, which includes semiconductor devices (not shown), interconnect structures (not shown), and contact pads (not shown), which are formed over interconnect structures to make electrical connections with the semiconductor devices. The semiconductor devices may be active or passive. The interconnect structures may include metal layers and different layers of vias, which are used to connect metal layers. The conductive layers of the interconnect structures are insulated by dielectric layers. The redistribution structure 402 is formed over contact pads to make electrical connection to contact pads and semiconductor devices in substrate 401. FIGS. 4A-4E only show region 400 of a single die. During processing, a number of dies are formed on substrate 401. At the end of the processing sequence, substrate 401 is sawed to separate into individual packaged die $110_A$.

The redistribution structure 402 includes one or more redistribution layers (RDLs) (not shown), which are insulated by passivation layers. A plating seed layer 404 is then formed on redistribution structure 402 as shown in FIG. 4B in accordance with some embodiments. Plating seed layer 404 is similar to plating seed layer 304 described above. In some embodiments, the thickness of the plating seed layer 404 is in a range from about 0.1 μm to about 1.0 μm. In some embodiments, the plating seed layer 404 includes a diffusion barrier layer, which is formed prior to the deposition of the plating seed layer. The plating seed layer 304 may also act as an adhesion layer to under layer. In some embodiments, the diffusion barrier layer is made of Ti with a thickness in a range from about 0.01 μm to about 0.1 μm.

After plating seed layer 404 is formed, a photoresist layer 405 is deposited and patterned over it, as shown in FIG. 4B in accordance with some embodiments. The process of forming photoresist layer 405 is similar to the process of photoresist layer 305. The material used for forming photoresist layer 405 could also be similar to photoresist layer 305. Following the patterning of photoresist layer 405, a conductive layer 407 is plated on the surface of exposed plating seed layer 404, such as over the surfaces in openings (406). The conductive layer 407 is made of copper, copper alloy, or a combination thereof in some embodiments. Afterward the conductive layer 407 is deposited, the photoresist layer 405 is removed, as shown in FIG. 4C in accordance with some embodiments. The removal process may involve dry or wet etching. After the photoresist layer 405 is removed, the conductive layer 407 in the openings 406 is exposed. In some embodiments, the thickness $T_2$ of conductive layer 407 formed in openings 406 is in a range from about 20 µm to about 80 µm. In some embodiments, the width $W_2$ of conductive layer 407 formed in openings 406 is in a range from about 60 µm to about 300 µm.

After photoresist layer 405 is removed, a photoresist layer 408 is deposited and patterned over substrate 401, as shown in FIG. 4D in accordance with some embodiments. The process of forming photoresist layer 408 is similar to the process of photoresist layer 405. The material used for forming photoresist layer 408 could also be similar to photoresist layer 405. The patterns of the photoresist layer 408 include openings ($409_I$) and ($409_{II}$). FIG. 4D shows that the sizes of openings ($409_I$) are substantially the same as the sizes of structures of conductive layer 407 of FIG. 4C. The sizes of openings ($409_{II}$) are smaller than the sizes of openings ($409_I$) to form smaller connectors (or bump structures). In some embodiments, the width $W_3$ of openings ($409_{II}$) is in a range from about 50 µm to about 290 µm.

Following the patterning of photoresist layer 408, a conductive layer 410 and a solder layer 411 are plated on substrate 401 to fill at least portions openings ($409_I$) and ($409_{II}$), as shown in FIG. 4D. The conductive layer 410 is made of copper, copper alloy, or a combination thereof in some embodiments. The solder layer 411 is formed over the conductive layer 410. Due to difference in sizes of openings ($409_I$) and ($409_{II}$), the thicknesses of conductive layer 410 and solder layer 411 formed in these two types of openings are different. Plating process would grow thicker films in wider openings. In some embodiments, the thickness $T_3$ of conductive layer 410 formed in openings $409_I$ is in a range from about 10 µm to about 60 µm, and the thickness $T_4$ of solder layer 411 in openings $409_I$ is in a range from about 20 µm to about 40 µm. In some embodiments, the thickness $T_5$ of conductive layer 410 formed in openings $409_{II}$ is in a range from about 12 µm to about 40 µm, and the thickness $T_6$ of solder layer 411 in openings $409_{II}$ is in a range from about 5 µm to about 40 µm.

Afterward the solder layer 407 is deposited, the photoresist layer 408 is removed, as shown in FIG. 4F in accordance with some embodiments. The removal process may involve dry or wet etching. After the photoresist layer 408 is removed, an etch process is performed to remove plating seed layer 404 not covered by the conductive layers 407, 410, and solder layer 411. The conductive layer 407, conductive layer 410, and solder layer 411 in the openings ($409_I$) are exposed to form external connectors (or bump structures) 412. Similarly, the conductive layer 410 and solder layer 411 in openings ($409_{II}$) are also exposed to form connectors (or bump structures) 413. A reflow process is then performed to prepare the external connectors 412 and 413 for bonding. FIG. 4E shows the connectors 412 and 413 after the reflow process, in accordance with some embodiments.

Following the reflow process described above, region 400 is singulated into individual piece from the entire substrate 401 and becomes packaged die $110_A$, which is ready for further packaging. The singulation process is a sawing process, in accordance with some embodiments.

Packaged die $110_B$ have one-size external connectors, as shown in FIG. 2A. The process sequence for forming external connectors of packaged die $110_B$ can be extracted from the process flows described in FIGS. 3A-3E and FIGS. 4A-4E.

After interconnect substrates 120', packaged dies $110_A$, and packaged dies $110_B$ are prepared or provided, they are assembled on substrates 130'. FIGS. 5A-5D illustrate cross-sectional views of a sequential flow of forming die package 100', in accordance with some embodiments. FIG. 5A shows that a substrate 130' is provided. Substrate 130' is include a number of bonding structures 501, which are formed over interconnect structure 505. In some embodiments, bonding structures 501 are bonding pads. In some embodiments, there is a solder layer over the bonding pads on each of the bonding structures 501, which becomes called bump structures. Interconnect structure 505 includes conductive layers, such as metal layers 503, vias (not shown), and vias 504, such as plating through holes (PTHs), formed in dielectric material(s) in accordance with some embodiments. Vias 504 are electrically connected to bonding pads 506 on the other side substrate 130'. Connectors would be formed on bonding pads 506 at a later stage, which will be described below. In some embodiments, substrate 130' includes dielectric material(s) made of a composite material composed of woven fiberglass cloth with an epoxy resin binder that is flame resistant.

Substrate 130' also includes an opening 502 to house interconnect substrate 120'. FIG. 5B shows that the interconnect substrate 120' being placed in opening 502 and being connected to the interconnect structure 505 of substrate 130'. FIG. 5B shows that solder balls 125' are placed in a space between the interconnect structure 505 and substrate 130". Solder balls 125' are soldered to neighboring conductive structure of interconnect structure 505 and contact structures 311 of interconnect substrate 120' to physically and electrically connect interconnect structure 120' with substrate 130', in accordance with some embodiments.

After the interconnect substrate 120' is bonded to substrate 130', packaged dies $110_A$ and $110_B$ are bonded to interconnect substrate 120' and substrate 130', as shown in FIG. 5C in accordance with some embodiments. Either packaged die $110_A$ or packaged die $110_B$ can by bonded first. In addition, after one packaged die is bonded, an electrical test can be conducted to ensure the bonding of the packaged die is good before the other packaged die is bonded. For example, packaged die $110_A$ is picked and placed over substrate 130' to be bonded to bonding structures 501 to form bonded structures $115_A$ and a portion of external connectors (or bump structures) 310 of interconnect substrate 120' to form bonded structures $115_B$. The bonding process involves solder reflow. Afterwards, an electrical test is conducted to ensure the bonding of packaged die $110_A$ yields good results before packaged die $110_B$ is bonded to the remaining connectors 310 of interconnect structure 120', in some embodiments. The electrical test enables screening of poorly bonded packaged dies to prevent wasting additional resources, such as packaged dies $110_B$, known bad packaged structures.

After the electrical test is done, packaged die $110_B$ is bonded to the remaining connectors 310 of interconnect structure 120' to form bonded structures $115_B$, in some embodiments. However, the electrical test can be optional. In some embodiments, another electrical test is performed after packaged die $110_B$ is bonded. This other electrical test can check the quality of bonding of packaged die $110_B$ to reduce waste of resources. After both packaged dies $110_A$ and $110_B$ are bonded to substrate 130' and interconnect substrate 120', a molding compound 512 is applied over substrate 130' to cover packed dies $110_A$ and $110_B$ and to fill the space underneath packaged dies $110_A$ and $110_B$, a shown in FIG. 5D in accordance with some embodiments. In some embodiments, an underfill (not shown) is applied to fill the space under packaged dies 110A and 110B before molding compound 512 is applied. A thermal reflow process is performed to set the molding compound 512. If an underfill is applied, a thermal reflow process is also performed immediately afterwards to set the underfill.

After the molding compound 512 is formed, external connectors (such as solder balls) 138' are formed on bonding pads 506 to form die package 100', as shown in FIG. 5D in accordance with some embodiments. The process could involve turning substrate 130' upside down and placing substrate 130' on a glue layer (not shown) with molding compound 512 contacting the glue layer. After substrate 130' is secured to the glue layer, solder balls 138' are placed over bonding pads 506 and are bonded to bonding pads 506 by reflow. Die package 100' is then singulated to be separated from other did packages 100' of substrate 130'. FIG. 5D shows die package 100' in accordance with some embodiments.

Figure 6:
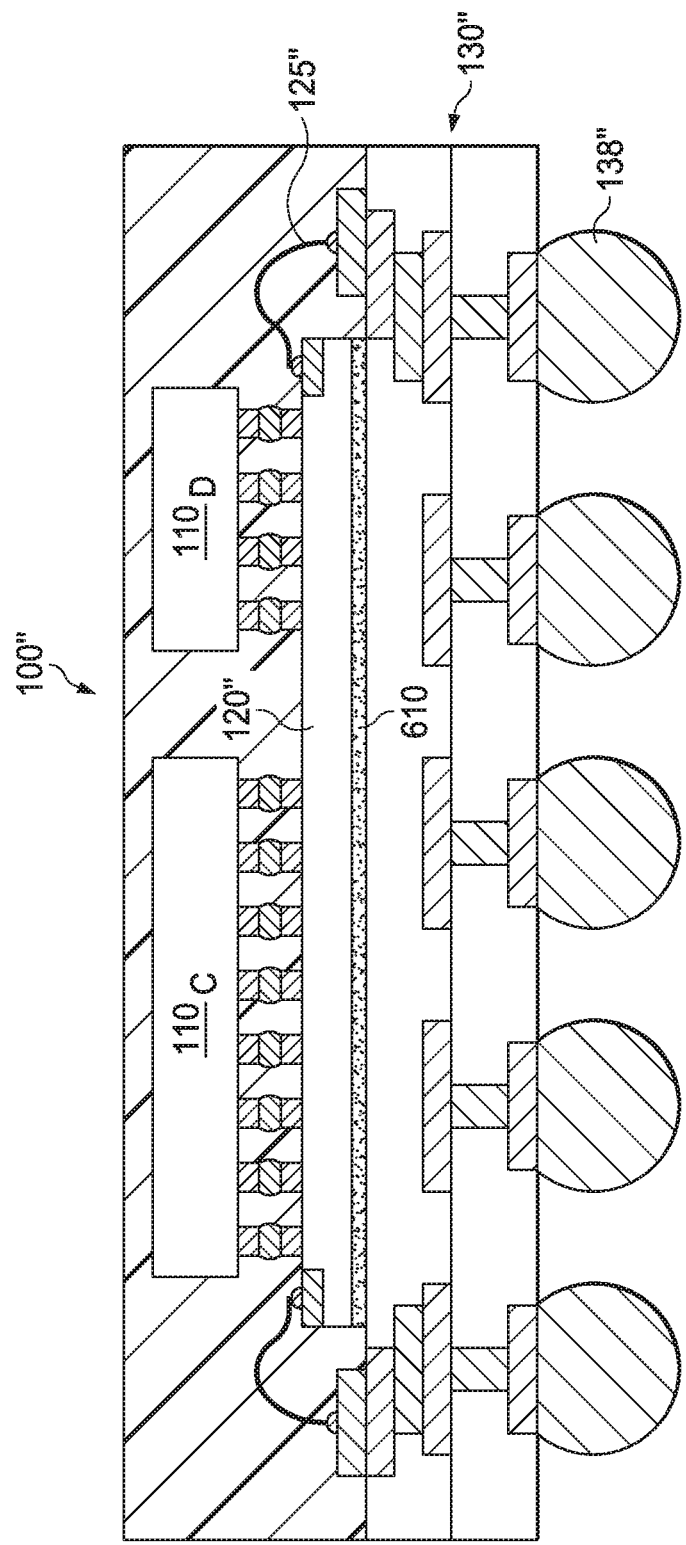
FIG. 6 shows a cross-sectional view of a die package, in accordance with some embodiments.

FIG. 6 shows a cross-sectional view of a die package 100", in accordance with some embodiments. Die package 100" includes a packaged die $110_C$ and a packaged die $110_D$. Both packaged die $110_C$ and packaged die $110_d$ have large numbers of inputs/outputs (I/Os). As a result, the external connectors for them are small bumps, such as micro-bumps (μ-bumps). Both packaged dies $110_C$ and $110_D$ are bonded to an interconnect substrate 120" to form bonding structures 115". A glue layer 610 is used to adhere interconnect substrate 120" to substrate (or package substrate) 130". The interconnect substrate 120" is electrically connected to interconnect structure 135' of substrate 130' via connecting devices, such as wire bonds 125". Other types of connecting devices, such as solder balls 125' described above may also be used. An opening similar to opening 502 described above to house interconnect substrate 120" may also be formed to accommodate interconnect substrate 120". FIG. 6 also shows external connectors 138" bonded to substrate 130".

The formation mechanisms for interconnect substrate 120" are similar to those of interconnect substrate 120'. The formation mechanisms for packaged dies $110_C$ and $110_D$ are similar to the formation mechanisms of packaged die $110_B$ described above. Substrate 130" is similar to substrate 130'; however, the interconnect structures and bonding structures on substrate 130" could be arranged differently from substrate 130'.

Figure 7C:
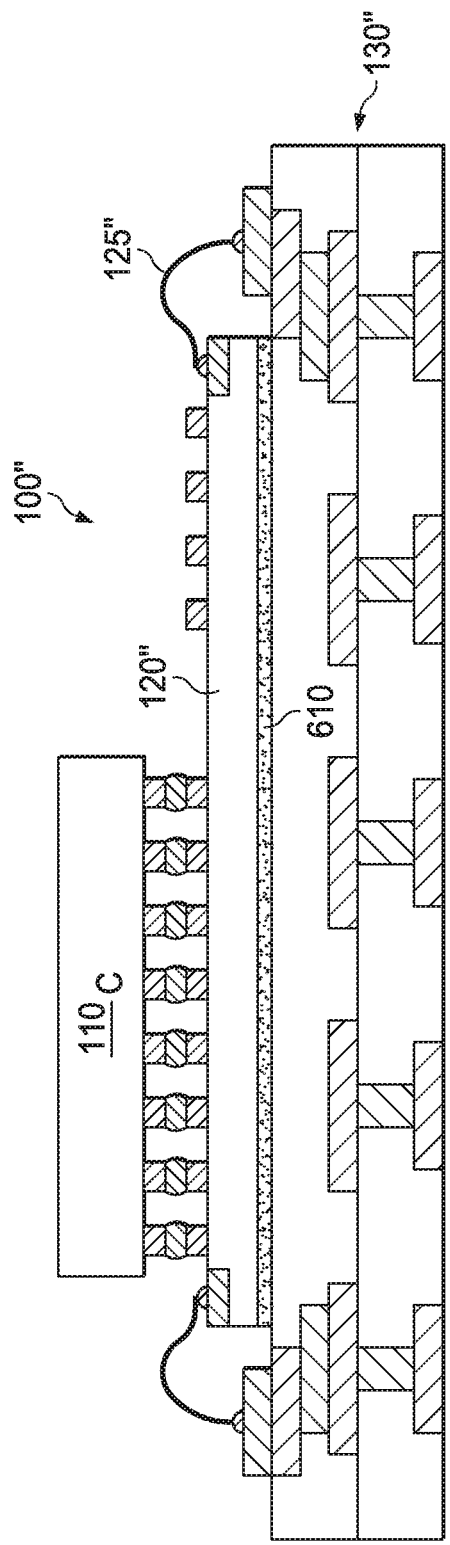

After interconnect substrate 120", packaged die $110_C$, and packaged die $110_D$ are prepared or provided, they are assembled on substrate 130". FIGS. 7A-7E illustrate cross-sectional views of a sequential flow of forming die package 100", in accordance with some embodiments. FIG. 7A shows a packaged die $110_C$ is picked and placed over a interconnect substrate 120" to be bonded to substrate 120". Packaged die $110_C$ is then bonded to interconnect substrate 120". Electrical testing (or probing) is then conducted to test the quality of bonding and to test the quality of packaged die $110_C$ by electrical probes 710, as shown in FIG. 7B in accordance with some embodiments. However, the electrical testing is optional.

Figure 7D:
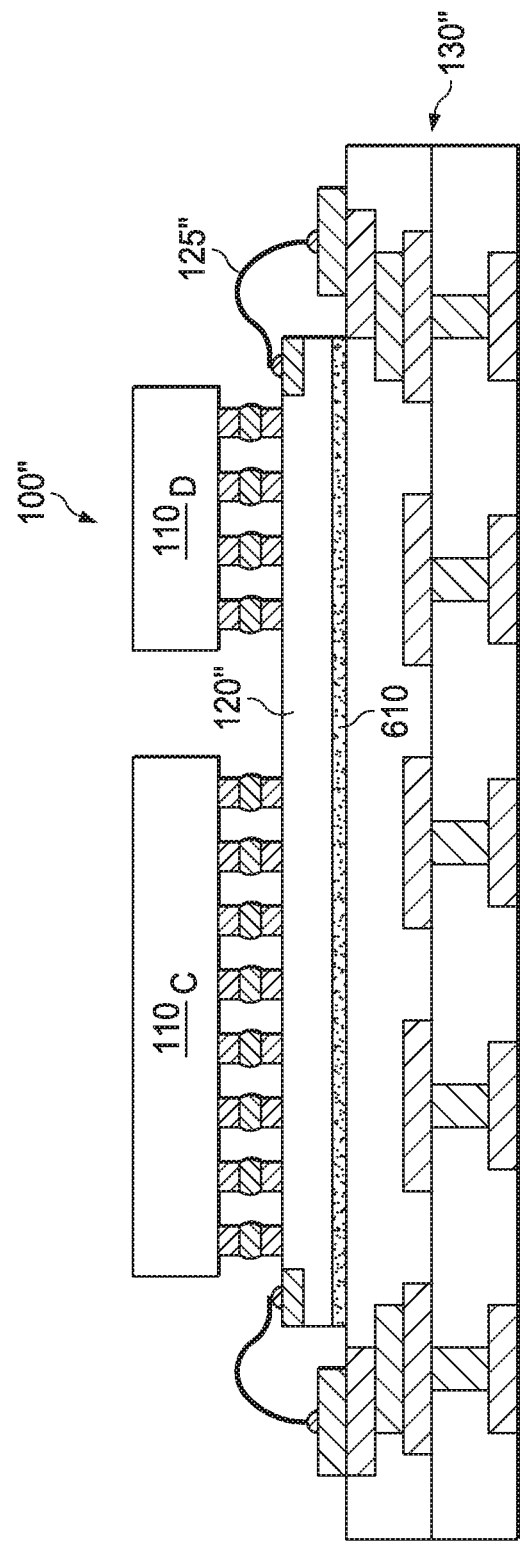

Afterwards, interconnect substrate 120" is attached to substrate 130", such as by a glue layer (not shown), as mentioned above. In addition, electrical connection is made between interconnect substrate 120" and substrate 130". FIG. 7C shows that the electrical connection is made by wire bonds 125", in accordance with some embodiments. Following making the electrical connection, a packaged die $110_D$ is placed over interconnect substrate 120" to be bonded to it, as shown in FIG. 7D in accordance with some embodiments.

Figure 7E:
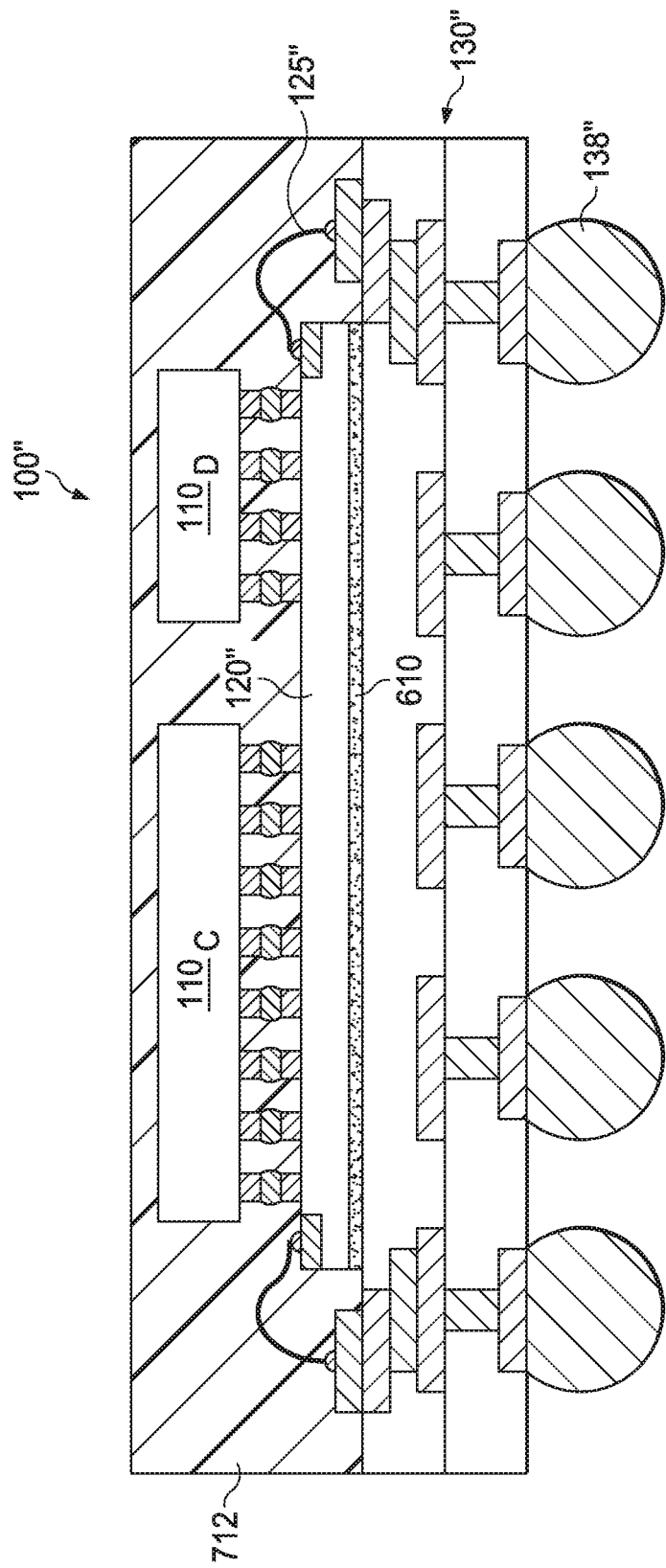

After packaged die $110_D$ is bonded to interconnect substrate 120", a molding compound 712 is formed over substrate 130" to protest packaged dies ($110_C$ and $110_D$) and substrate (120") and connecting structures (bonding structures between packaged dies and substrate 120", and wire bonds 125") over substrate 130". In some embodiments, an underfill is first formed under packaged dies $110_C$ and $110_D$ prior to forming molding compound 712. However, forming the underfill first is optional. Some molding compound materials can also act as underfill to fill the space between packaged dies $110_C/110_D$ and substrate 120". After the molding compound 812 is formed, external connectors 138" are formed on the opposite side (opposite from bonded packaged dies $110_C$ and $110_D$) to form die package 100", as shown in FIG. 7E. As mentioned above, each substrate 130" could include a number of die packages. Die packages 100" are then singulated into individual pieces. FIG. 8E shows die package 100" after it has been singulated.

The process flow described above to form die package 100" is merely one embodiment. Other process flow may also be used. For example, interconnect substrate 120" could have been placed on substrate 130" first before packaged dies $110_C$ and $110_D$ being bonded to substrate 120". Further, packaged die $110_D$ could have been bonded to interconnect substrate 120" before packaged die 110. Choosing which die to bond first depends on the components on die package 100" and how these components are used. For example, packaged die $110_C$ may be bonded first because the testing of packaged die $110_D$ could require the presence of package die $110_C$. Other considerations may be needed in deciding the sequence of bonding and whether to conduct electrical testing in the sequence of forming die package 100".

Figure 8:
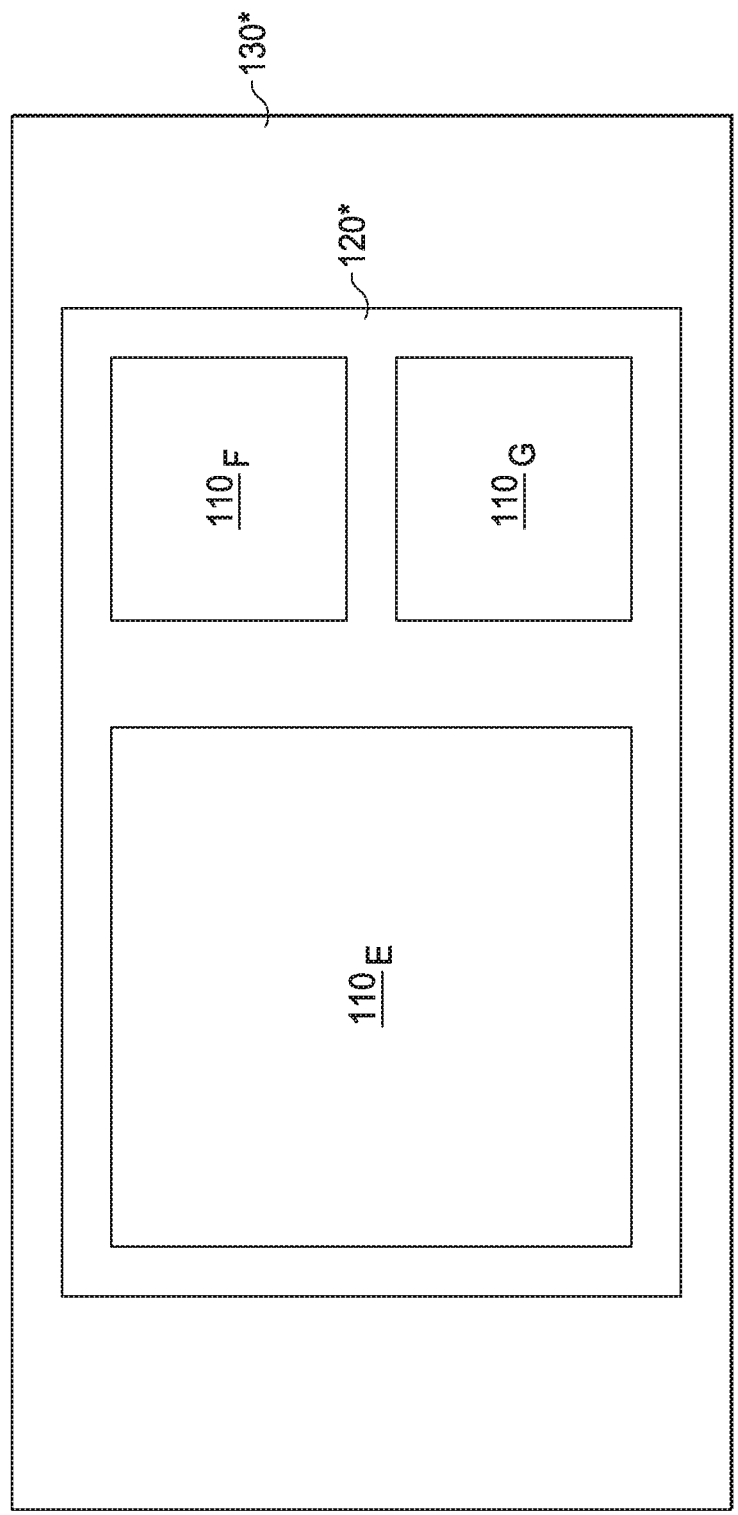
FIG. 8 shows a top view of a die package, in accordance with some embodiments.

The embodiments described above show two packaged dies bonded in each die package, such as packaged dies $110_A$ and $110_B$ on die package 100' or packaged dies $110_C$ and $110_D$ on die package 100". There could be more than two packaged dies on each die package. FIG. 8 shows a top view of a die package 100* with three packaged dies, $110_E$, $110_F$, and $110_G$, bonded an interconnect substrate 120*, which is bonded to a substrate 130*, in accordance with some embodiments. Interconnect substrate 120* is similar to interconnect 120" described above and substrate 130* is similar to substrate 130" described above. The cross-sectional view of die package 100 is similar to the cross-sectional view of die package 100" of FIG. 6. Higher number of die packages, such as 4, 5, or more, could be arranged and connected to the interconnect substrate 120 similar to substrate 120' or 120" described above and be directly or indirectly connected to a substrate similar to substrate 130' or 130" described above.

Embodiments of mechanisms for forming a die package with multiple packaged dies on a package substrate use an interconnect substrate to provide electrical connections between dies and the package substrate. The usage of the interconnect substrate enables cost reduction because it is cheaper to make than an interposer with through silicon vias (TSVs). The interconnect substrate also enables dies with different sizes of bump structures to be packaged in the same die package.

In some embodiments, a semiconductor die package is provided. The semiconductor die package includes a first packaged die, and a second packaged die. The semiconductor die package also includes an interconnect substrate with a redistribution structure. The first packaged die and the second packaged die are bonded to the redistribution structure. The semiconductor die package further includes a package substrate with an interconnect structure, and the interconnect substrate is bonded to the package substrate. The package substrate is electrically connected to both the first packaged die and the second packaged die.

In some other embodiments, a method of forming a semiconductor die package is provided. The method includes bonding an interconnect substrate to a package substrate, and bonding a first packaged die to the package substrate and to the interconnect substrate. The method also includes bonding a second packaged die to the interconnect substrate. The method further includes forming a molding compound over the packaged substrate to cover the first package die and the second package die bonded to the package substrate and the interconnect substrate. In addition, the method includes forming external connectors of the package substrate.

In yet some other embodiments, a method of forming a semiconductor die package is provided. The method includes bonding a first packaged die to an interconnect substrate, and performing an electrical test after bonding the first packaged die to the interconnect substrate. The method also includes adhering the interconnect substrate to a package substrate, and making electrical connection between the interconnect substrate and the package substrate. The method further includes bonding a second packaged die to the interconnect substrate.

In yet some other embodiments, a semiconductor package includes a package substrate, an interconnect substrate bonded to the package substrate, a bottommost surface of the interconnect substrate being lower than a topmost surface of the package substrate, and a conductive connector electrically coupling the interconnect substrate to the package substrate, the conductive connector physically contacting a sidewall of the interconnect substrate. The semiconductor package further includes a first integrated circuit die bonded to the interconnect substrate through first bonding structures and bonded to the package substrate through second bonding structures, the first bonding structures and the second bonding structures having different sizes.

In yet some other embodiments, a semiconductor package includes a package substrate, the package substrate including an interconnect structure, an interconnect substrate extending into the package substrate, and a conductive connector physically contacting a sidewall of the interconnect substrate and a portion of the interconnect structure, the conductive connector electrically coupling the interconnect substrate to the package substrate. The semiconductor package further includes a first integrated circuit die bonded to the interconnect substrate through first bonding structures and bonded to the package substrate through second bonding structures, the second bonding structures being larger than the first bonding structures.

In yet some other embodiments, a semiconductor package includes a package substrate, an interconnect substrate bonded to the package substrate, a bottommost surface of the interconnect substrate being lower than a topmost surface of the package substrate, and a conductive connector electrically coupling the interconnect substrate to the package substrate, a bottommost surface of the conductive connector being lower than the topmost surface of the package substrate. The semiconductor package further includes a molding compound over the package substrate, the interconnect substrate and the conductive connector, the molding compound physically contacting a topmost surface of the conductive connector, no portion of the molding compound extending below the bottommost surface of the interconnect substrate.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor package comprising:
   a package substrate;
   a redistribution structure bonded to the package substrate, a bottommost surface of the redistribution structure being lower than a topmost surface of the package substrate;
   a conductive connector electrically coupling the redistribution structure to the package substrate, the conductive connector physically contacting a sidewall of the redistribution structure;
   a first integrated circuit die bonded to the redistribution structure through first bonding structures and bonded to the package substrate through second bonding structures, the first bonding structures and the second bonding structures having different sizes; and
   a second integrated circuit die bonded to the redistribution structure through third bonding structures, wherein the second integrated circuit die is completely within a perimeter of the redistribution structure in a plan view.

2. The semiconductor package of claim 1, wherein the first bonding structures and the third bonding structures have a same size.

3. The semiconductor package of claim 1, wherein the first integrated circuit die overlaps the perimeter of the redistribution structure in the plan view.

4. The semiconductor package of claim 1, wherein the second bonding structures are larger than the first bonding structures.

5. The semiconductor package of claim 1, further comprising a molding compound over the package substrate, the redistribution structure and the first integrated circuit die, the molding compound extending along a topmost surface of the conductive connector.

6. The semiconductor package of claim 5, wherein a portion of the molding compound is interposed between the first integrated circuit die and the conductive connector.

7. The semiconductor package of claim 5, wherein the bottommost surface of the redistribution structure is free from the molding compound.

8. The semiconductor package of claim 1, further comprising external connectors bonded to the package substrate, the package substrate being interposed between the external connectors and the redistribution structure.

9. A semiconductor package comprising:
   a package substrate, the package substrate comprising an interconnect structure;
   a redistribution structure extending into the package substrate, wherein the redistribution structure is a continuous structure;
   a conductive connector physically contacting a sidewall of the redistribution structure and a portion of the interconnect structure;
   a first integrated circuit die bonded to the redistribution structure through first bonding structures and bonded to the package substrate through second bonding structures, the second bonding structures being larger than the first bonding structures; and
   a second integrated circuit die bonded to the redistribution structure through third bonding structures, the second bonding structures being larger than the third bonding structures, wherein the second integrated circuit die is electrically coupled to the package substrate through the redistribution structure and not through additional bonding structures directly bonded to the package substrate and spaced apart from the redistribution structure, wherein the first integrated circuit die overlaps an edge of the redistribution structure in a plan view, and wherein the second integrated circuit die overlaps an interior region of the redistribution structure in the plan view.

10. The semiconductor package of claim 9, wherein a bottommost surface of the redistribution structure is lower than a topmost surface of the package substrate.

11. The semiconductor package of claim 9, further comprising a molding compound encapsulating the first integrated circuit die, wherein a portion of the molding compound is interposed between the first bonding structures and the second bonding structures and physically contacts a topmost surface of the conductive connector.

12. The semiconductor package of claim 11, wherein no portion of the molding compound is interposed between a bottommost surface of the redistribution structure and the package substrate.

13. The semiconductor package of claim 11, wherein the molding compound extends along a topmost surface of the first integrated circuit die.

14. The semiconductor package of claim 9, wherein a bottommost surface of the conductive connector is lower than a topmost surface of the package substrate.

15. A semiconductor package comprising:
   a package substrate;
   a redistribution structure bonded to the package substrate, a bottommost surface of the redistribution structure being lower than a topmost surface of the package substrate;
   a conductive connector electrically coupling the redistribution structure to the package substrate, a bottommost surface of the conductive connector being lower than the topmost surface of the package substrate;
   a molding compound over the package substrate, the redistribution structure and the conductive connector, the molding compound physically contacting a topmost surface of the conductive connector, no portion of the molding compound extending below the bottommost surface of the redistribution structure; and
   a first integrated circuit die and a second integrated circuit die embedded into the molding compound, wherein the molding compound completely covers sidewalls of the first integrated circuit die and sidewalls of the second integrated circuit die.

16. The semiconductor package of claim 15, wherein the first integrated circuit die is electrically coupled to the redistribution structure through first bonding structures, wherein the first integrated circuit die is electrically coupled to the package substrate through second bonding structures, and wherein a width of the second bonding structures is different from a width of the first bonding structures.

17. The semiconductor package of claim 16, wherein the width of the second bonding structures is greater than a width of the first bonding structures.

18. The semiconductor package of claim 16, wherein the second integrated circuit die is electrically coupled to the redistribution structure through third bonding structures, and wherein the width of the second bonding structures is different from a width of the third bonding structures.

19. The semiconductor package of claim 18, wherein the width of the first bonding structures is substantially same as the width of the third bonding structures.

20. The semiconductor package of claim 15, further comprising external connectors electrically coupled to the package substrate, the package substrate being interposed between the external connectors and the molding compound.

* * * * *